(12) United States Patent
Iwaki et al.

(10) Patent No.: US 6,208,170 B1
(45) Date of Patent: Mar. 27, 2001

(54) SEMICONDUCTOR INTEGRATED CIRCUIT HAVING A SLEEP MODE WITH LOW POWER AND SMALL AREA

(75) Inventors: Hiroaki Iwaki; Kouichi Kumagai, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/286,029

(22) Filed: Apr. 5, 1999

(30) Foreign Application Priority Data

Apr. 6, 1998 (JP) .................................................. 10-093245

(51) Int. Cl.⁷ ........................ H03K 19/094; H03K 19/096
(52) U.S. Cl. ........................ 326/121; 326/121; 326/119; 326/93; 326/95; 326/17; 326/30
(58) Field of Search .................................. 326/121, 119, 326/93, 95, 17, 30

(56) References Cited

U.S. PATENT DOCUMENTS

| | | | |
|---|---|---|---|
| 5,594,371 | * 1/1997 | Douseki | 326/119 |
| 5,606,265 | * 2/1997 | Sakata et al. | 326/34 |
| 5,610,533 | * 3/1997 | Arimoto et al. | 326/33 |
| 5,726,562 | 3/1998 | Mizuno . | |
| 6,049,245 | * 4/2000 | Son et al. | 327/544 |

FOREIGN PATENT DOCUMENTS 5-281929 11/1993 (JP) .
6-29834 2/1994 (JP) .

OTHER PUBLICATIONS

Japanese Abstract 08138381 published May 31, 1996.

* cited by examiner

Primary Examiner—Michael Tokar
Assistant Examiner—Vibol Tan
(74) Attorney, Agent, or Firm—Scully, Scott, Murphy & Presser

(57) ABSTRACT

A semiconductor integrated circuit includes a power supply circuit having a global source line VCC, a local source line QVCC coupled to VCC by a source switching transistor, and a global ground line VSS, a low-threshold logic (combinational) circuit connected between QVCC and VSS, and a data storage (sequential) circuit, connected between VCC and VSS. The data storage circuit includes a low-threshold input section for receiving data from the logic circuit and a high-threshold latch section for latching the data received by the input section. Mode switching transistors are inserted between the low-threshold logic circuit and VSS, between low-threshold input section and VCC and between the low-threshold input section and VSS, for effecting a sleep mode of the semiconductor integrated circuit. Low power dissipation is maintained with a reduced circuit scale.

6 Claims, 8 Drawing Sheets

SEMICONDUCTOR INTEGRATED CIRCUIT HAVING A SLEEP MODE WITH LOW POWER AND SMALL AREA

BACKGROUND OF THE INVENTION (a) Field of the Invention

The present invention relates to a semiconductor integrated circuit having a sleep mode with low power and small area and, more particularly, to a semiconductor integrated circuit including a power supply circuit having a global source line, a global ground line, and a local source line or a local ground line for operating at a reduced power dissipation with a smaller area.

(b) Description of the Related Art

A large-scale semiconductor integrated circuit (LSI) is more and more required to have a long continuous operation with a low voltage buttery drive, which is accelerated by recent developments of portable data assistants. Thus, an LSI incorporated in a portable data assistant is increasingly required to operate with reduced power dissipation, at a high speed on a reduced source voltage. In order to operate a CMOS LSI on a reduced source voltage without reduction of the operational speed, it is preferable that the CMOS LSI operate on a reduced threshold voltage for the CMOSFETs. However, it is generally known that CMOSFETs operating on a reduced threshold voltage are more liable to a penetrating current problem compared to CMOSFETs having a higher threshold voltage, the penetrating current causing higher power dissipation.

Patent Publication JP-A-6-29834 proposes an LSI capable of solving the problem penetrating current, wherein CMOSFETs operate with reduced power dissipation. Referring to FIG. 1, the proposed LSI includes logic circuits (combinational circuits) 301 and 302 having a low threshold voltage (Vth), a data storage circuit (sequential circuit) 303, having a high threshold voltage, for transferring data between the logic circuits 301 and 302, and a power source circuit having four source lines: a global source line VCC, a local source line QVCC, a global ground line VSS and a local ground line QVSS.

A switching transistor 304 is provided between the global source line VCC and the local source line QVCC, whereas a switching transistor 305 is provided between the global ground line VSS and the local ground line QVSS. The low-threshold logic circuits 301 and 302 are connected between the local source line QVCC and the local ground line QVSS for power supply, whereas the high-threshold data storage circuit 303 is connected between the global source line VCC and the global ground line VSS for power supply.

FIG. 2 shows practical configurations of the vicinity of the output stage of the low-threshold logic circuit 301 and the detail of the high-threshold data storage circuit 303 in the LSI of FIG. 2. The output stage of the low-threshold logic circuit 301 is implemented by a CMOS inverter gate including a low-threshold pMOSFET 312 and a low-threshold nMOSFET 313. The low-threshold logic circuit 301 as a whole including the output stage CMOS inverter gate and an inverter gate 311 for driving the output stage CMOS inverter gate is connected between the local source line QVCC and the local ground line QVSS.

The data storage circuit 303 is implemented by a latch circuit in this example. The latch circuit 303 includes a low-threshold inverter gate 317, a pair of high-threshold inverter gates 316 and 318, a pair of low-threshold transfer gates 314 and 315, and a pair of high-threshold pMOSFET 319 and nMOSFET 320. The high-threshold inverter gates 316 and 318 are connected directly to the global source line VCC and the global ground line VSS. The low-threshold inverter gate 317 is connected to the global source line VCC via the high-threshold pMOSFET 319, and to the global ground line VSS via the high-threshold nMOSFET 320.

In the conventional LSI as described above, leakage current is suppressed during a sleep mode by the high-threshold switching transistors 304 and 305 connected in the possible leakage path formed in the low-threshold logic circuit from the global source line VCC to the global ground line VSS. The switching transistors 304 and 305 as used herein should have a larger gate width because these switching transistors 304 and 305 pass a large source current. The larger gate width or transistor size, however, involves a large chip size for the LSI.

SUMMARY OF THE INVENTION

It is therefore an object of the present invention to provide a semiconductor integrated circuit capable of reducing the chip size while assuring a low power dissipation equivalent to the power dissipation in the conventional semiconductor integrated circuit as described in JP-A-6-29834.

The present invention provides a semiconductor integrated circuit comprising: a power source circuit including a first global source line, a local source line coupled to the first global source line by a source switching transistor, and a second global source line; a low-threshold logic circuit connected between the local source line and the second global source line, the low-threshold logic circuit including an output stage; a data storage circuit connected between the first global source line and the second global source line, the data storage circuit including a low-threshold input section for receiving a data signal from the output stage and a high-threshold latch section for latching the data signal received by the input section, the power source circuit further including a first mode switching transistor for coupling the output stage and the second global source line, a second mode switching transistor for coupling the input section and the first global source line, and a third mode switching transistor for coupling the input section and the second source line, each of the first through third mode switching transistors and the source switching transistor being controlled by a mode signal for supplying electric power from the first and second global source lines.

In accordance with the semiconductor integrated circuit of the present invention, low power dissipation equivalent to that in the conventional semiconductor integrated circuit having four source lines can be obtained with a smaller number of the source lines.

The above and other objects, features and advantages of the present invention will be more apparent from the following description, referring to the accompanying drawings.

PREFERRED EMBODIMENTS OF THE INVENTION

Figure 1:
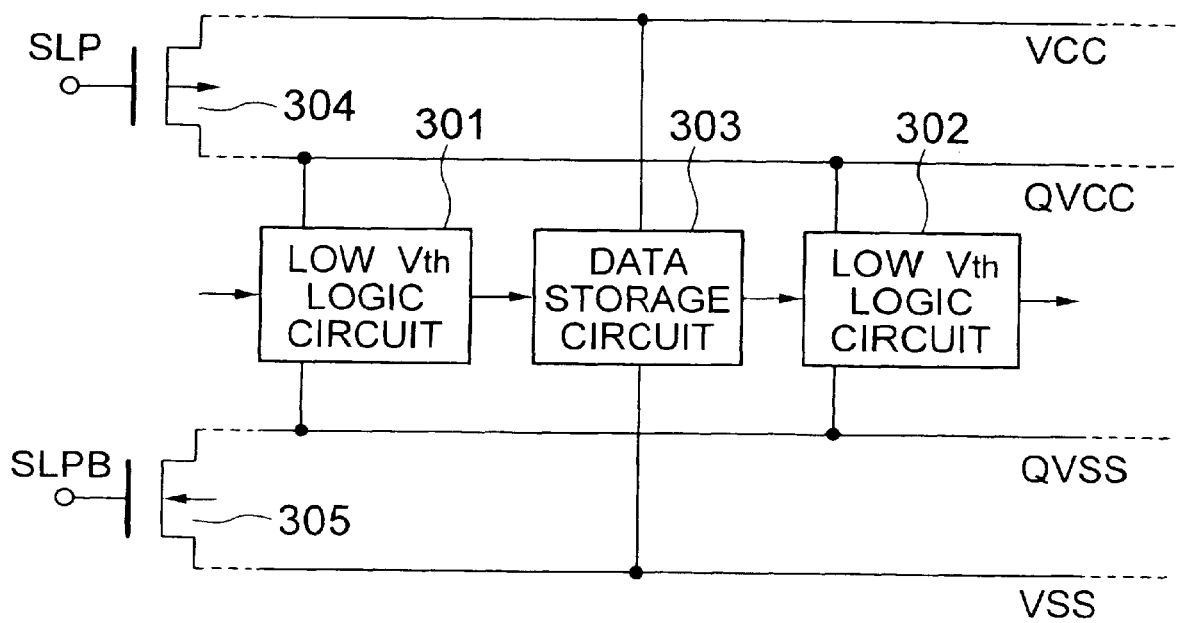
FIG. 1 is a schematic block diagram of a conventional semiconductor integrated circuit.

Now, the present invention is more specifically described with reference to accompanying drawings, wherein similar constituent elements are designated by similar reference numerals.

Figure 3:
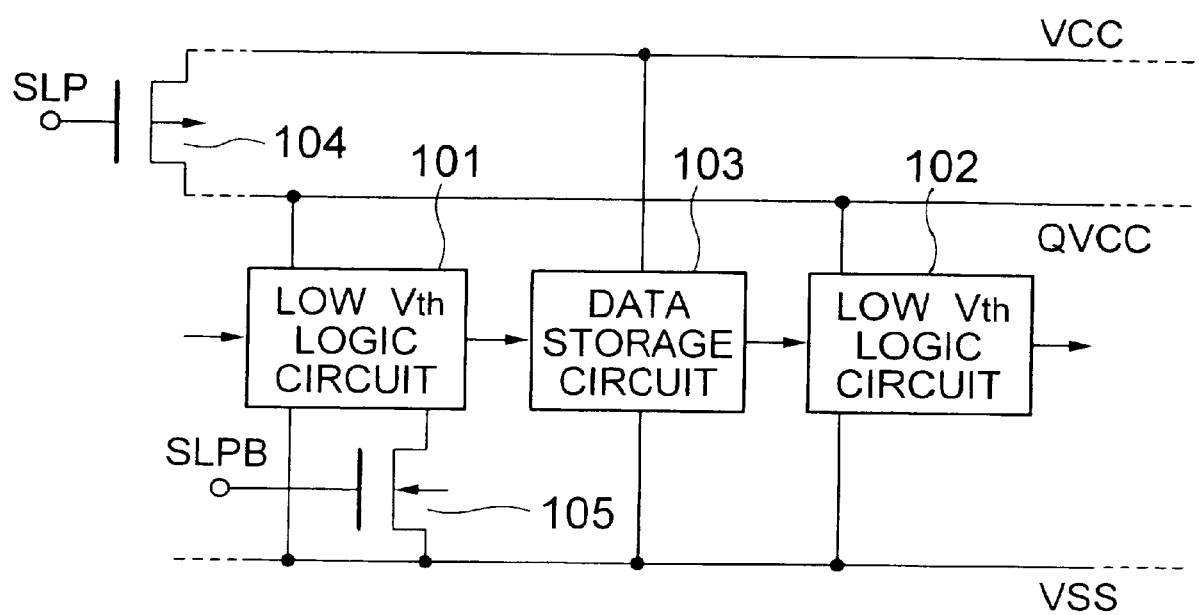
FIG. 3 is a schematic block diagram of a semiconductor integrated circuit according to a first embodiment of the present invention.

Referring to FIG. 3, a semiconductor integrated circuit according to a first embodiment of the present invention includes logic circuits (combinational circuits) 101 and 102 having a low threshold voltage (Vth), a data storage circuit (sequential circuit) 103, having a high threshold voltage, for transferring data between the logic circuits 101 and 102, and a power source circuit having three source lines: a global source line (first global source line) VCC, a local source line QVCC and a global ground line (second global source line) VSS.

A source switching transistor 104 is provided between the global source line VCC and the local source line QVCC, whereas a mode switching transistor 105 is provided between the global source line VSS and the low-threshold logic circuit 101. As detailed hereinafter, the semiconductor integrated circuit enters an active mode or a sleep mode (standby mode) by controlling the source switching transistor 104 and the mode switching transistor 105.

The transistors in the low-threshold logic circuits 101 and 102 have a lower threshold, whereby the semiconductor integrated circuit operates at a high speed. The low-threshold (voltage) logic circuits in the semiconductor integrated circuit are categorized into two types in terms of source voltage. Specifically, the logic circuit 102 is of the first type connected directly to the local source line QVCC and the global ground line VSS. The logic circuit 101 is of the second type having a first circuit section connected directly to the local source line QVCC and the global ground line VSS, and a second circuit section connected directly to the local source line VCC and to the global ground line VSS through the switching transistor 105 having a high threshold voltage.

The data storage circuit 103 includes low-threshold transistors as well as high-threshold transistors, and supplied with source voltage directly from the global source line VCC and the global ground line VSS. The configurations of the data storage circuit 103 are similar to those of the data latch circuit 303 in FIG. 1.

The semiconductor integrated circuit of the present embodiment has a function similar to that described in JP-A-6-29834 despite the fact that the semiconductor integrated circuit of the present embodiment has only three source lines. It is to be noted that although the semiconductor integrated circuit of the present embodiment has the global source line VCC, the local source line QVCC and the global ground line VSS, similar advantages can be obtained so long as the semiconductor integrated circuit has three of the global source line/local source line and the global ground line/local ground line. In the present embodiment, the mode switching transistor 105 has a gate width significantly smaller than the gate width of the source switching transistor 305 in FIG. 1, whereby the semiconductor integrated circuit of the present embodiment has a smaller occupied area compared to the semiconductor integrated circuit of FIG. 1.

In FIG. 3, each of the low-threshold logic circuits 101 and 102 is implemented by a combinational circuit, which generally includes a functional circuit block or a functional macro block. The data storage circuit 103 is implemented by a sequential circuit, which generally includes a latch circuit or a flipflop (F/F). The switching transistor 104 connected between the global source line VCC and the local source line QVCC has a high threshold voltage and is controlled by a mode signal SLP to select an active mode or a sleep mode of the semiconductor integrated circuit.

Figure 2:
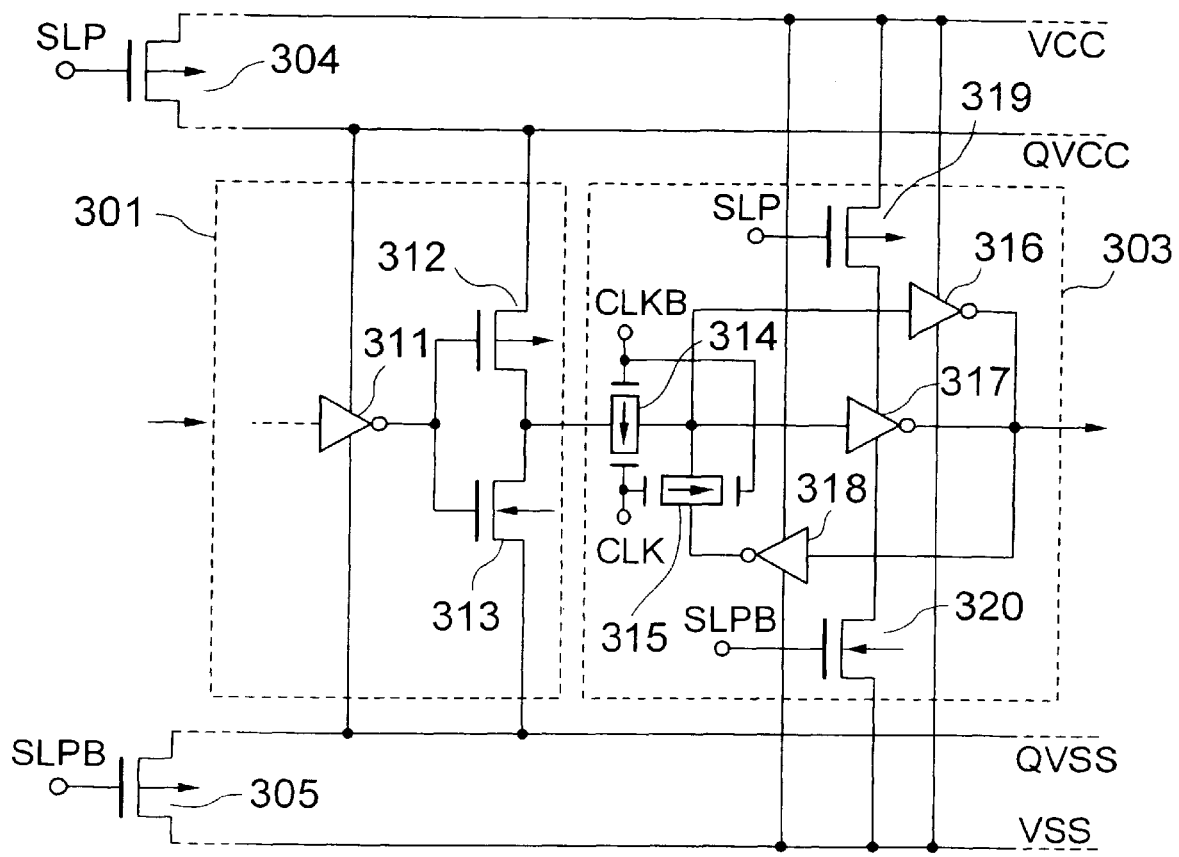
FIG. 2 is a detail circuit diagram of a portion of the semiconductor integrated circuit of FIG. 1.
Figure 4:
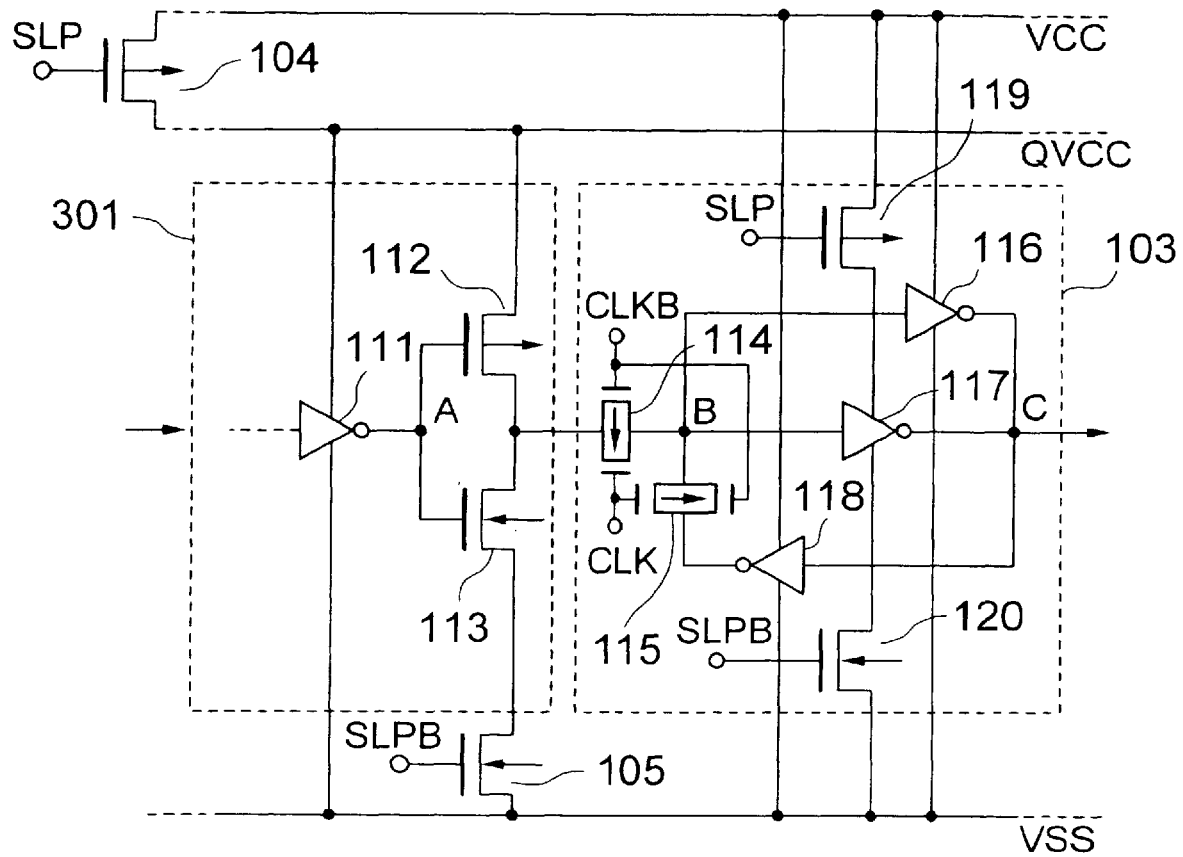
FIG. 4 is a circuit diagram of a portion of the semiconductor integrated circuit of FIG. 3.

Referring to FIG. 4 showing the detail of the semiconductor integrated circuit of FIG. 3 similarly to FIG. 2, the output stage of the low-threshold logic circuit 101 is implemented by a CMOS inverter gate including a low-threshold pMOSFET 112 and a low-threshold nMOSFET 113. The source of the pMOSFET 112 is connected to the local source line QVCC and the source of the nMOSFET 113 is connected through the high-threshold nMOSFET 105 to the global ground line VSS. The other circuit section of the low-threshold logic circuit 101 including the inverter 111 for driving the output stage CMOS inverter is directly connected to the local source line QVCC and the global ground line VSS. The nMOSFET 105 is controlled by a mode signal SLPB which is a complement of the mode signal SLP. By implementing the transistors in the low-threshold logic circuit as low-threshold transistors, a high-speed signal transmission can be obtained in the present embodiment.

The data storage circuit 103 is implemented by a latch circuit in this example. The latch circuit 103 includes a low-threshold transfer gate 114 for receiving and passing an input data signal, a low-threshold inverter gate 117 and a high-threshold inverter gate 116 both having inputs connected to the output node "B" of the latch circuit, a high-threshold pMOSFET 118 for feeding-back the potential on the output node "C" of both the inverter gates 116 and 117 to the input node "B" thereof after inversion through a low-threshold transfer gate 115, and a high-threshold pMOSFET 119 and a high-threshold nMOSFET 120 both for connecting the low-threshold inverter gate 117 to the global source line VCC and the global ground line VSS, respectively. Each of the transfer gates 114 and 115 may be implemented by a pair of pMOSFET and nMOSFET connected in parallel. The transfer gates 114 and 115 are controlled by a pair of complementary clock signals CLK/CLKB, whereas the pMOSFET 119 and the nMOSFET 120 are controlled by a pair of complementary mode signals SLP/SLPB.

In the semiconductor integrated circuit of the present embodiment, switching transistors constituting a part of the power source circuit are controlled by the mode signals SLP/SLPB, to turn on the high-threshold pMOSFETs 104 and 119 and the high-threshold nMOSFETs 105 and 120 for entering an active mode, or to turn off these transistors 104, 119, 105 and 120 for entering a sleep mode. The latch circuit 103 is controlled by the clock signals CLK/CLKB, to turn on and off the transfer gates 114 and 115, respectively, for passing an input data signal therethrough, and to turn off and on the transfer gates 114 and 115, respectively, for latching the data signal passed therethrough.

Figure 5:
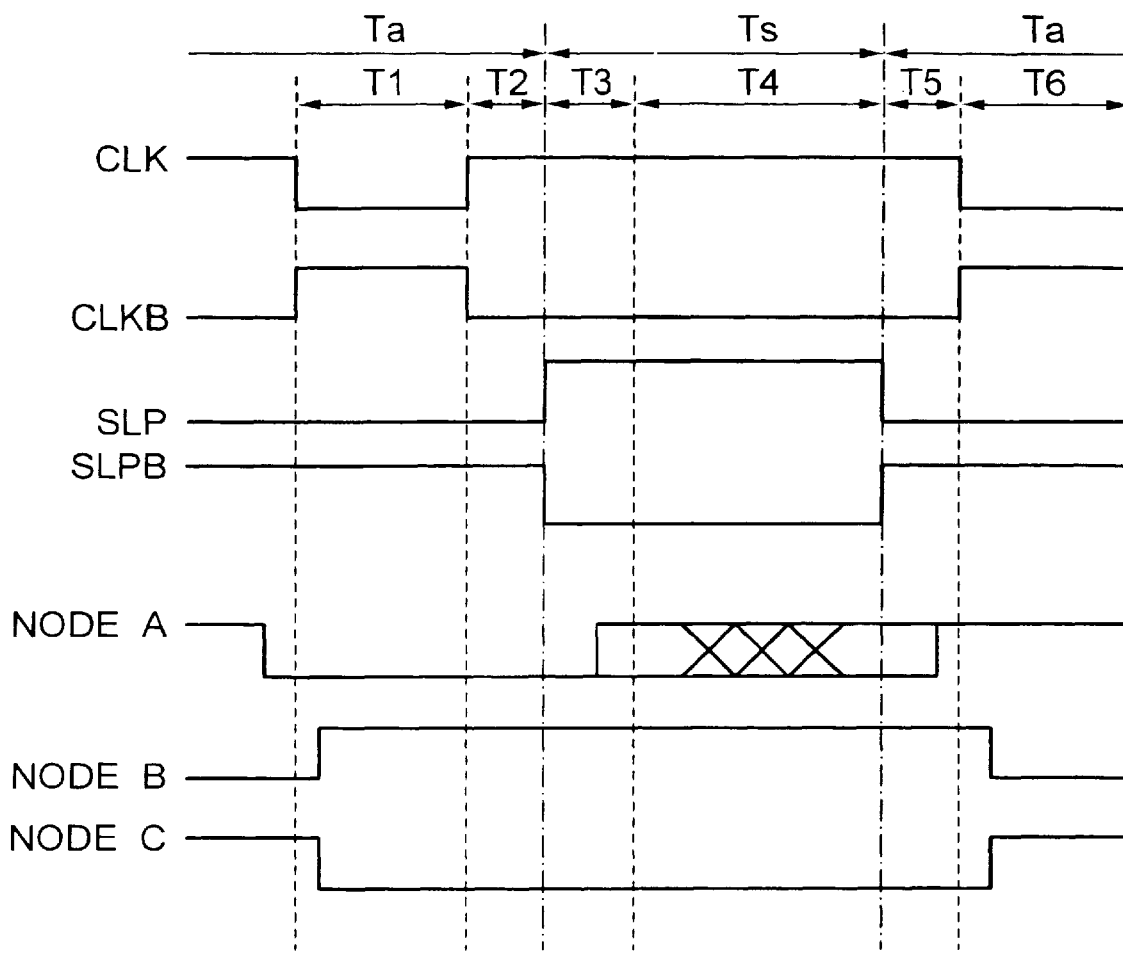
FIG. 5 is a signal timing chart of the semiconductor integrated circuit of FIG. 3.

Referring to FIG. 5, there are shown clock signals CLK/CLKB, mode signals SLP/SLPB, and signal potentials on the nodes "A", "B" and "C" in the semiconductor integrated circuit of FIG. 4. The time periods Ta and Ts denote an active mode and a sleep mode, respectively, of the semiconductor integrated circuit. The operation of the integrated circuit will be described hereinafter by further dividing these periods Ta and Tb into six periods T1 to T6.

In period T1, mode signal SLP is at a low level (namely, SLPB is at a high level) to effect an active mode. In addition, clock signal CLK is at a low level (namely, CLKB is at a high level) in period T1 to allow the latch circuit 103 to pass data therethrough. Thus, a data "Low", for example, input to node "A" is transferred through the CMOS inverter gate including low-threshold pMOSFET 112 and low-threshold nMOSFET 113 and the low-threshold inverter gate 114 to node "B" as a data "High", which is further transferred to node "C" as a data "Low" through the low-threshold inverter gate 117. Since the signal path from node "A" to node "C" is implemented by low-threshold transistors, the data is transferred at a high speed.

In period T2, mode signal SLP is at a low level as in the case of period T1, to maintain the active mode. In this period T2, however, clock signal CLK rises from a low level to a high level to turn off and on the transfer gates 114 and 115, respectively, thereby allowing the latch circuit 103 to operate in a latch mode. Thus, the data signal input to node "A" as a data "Low" is held at the nodes "B" and "C" as data "High" and "Low", respectively, in the latch section of the data storage circuit including the inverter gates 116 and 118.

In period T3, mode signal SLP rises from a low level to a high level to turn off the switching transistor 104, thereby effecting a sleep mode to allow the local source line QVCC to enter a floating state. As a result, the output node "A" of the inverter gate 111, which receives the signal potential from the local source line QVCC, is isolated from the source line to enter a floating state. In addition, the switching transistors 119 and 120 are also turned off, whereby the source potentials from the global source line VCC and the global ground line VSS are not supplied to the low-threshold inverter gate 117. Thus, the inverter gate 117 enters an inactive state. At this stage, the data on the nodes "B" and "C" are maintained by the high-threshold inverter gates 116 and 118.

In period T4, the state or signals of the integrated circuit appeared in period T3 is simply maintained for power saving during the sleep mode of the semiconductor integrated circuit. In this period T4, the inverter gates 116 and 118 constituting the latch section maintain the data "High" and "Low" on nodes "B" and "C", due to the potential supply from the global source line VCC and the global ground line VSS. At this stage, the leakage current path possibly formed in the low-threshold transistor 113 from node "B" maintained at a high level to the global ground line VSS is blocked by the high-threshold switching transistor 105 which is off due to the low level of the mode signal SLPB. Thus, the leakage current passing the low-threshold transistor 113 during the sleep mode is extremely low and can be neglected. If the data held on nodes "B" and "C" at this stage is contrary to this example, the leakage current path possibly formed in the low-threshold inverter gate 117 from the node "C" maintained at a high level to the global ground line VSS is blocked by the high-threshold switching transistor 120 which is off due to the low level of the mode signal SLPB.

In period T5, after mode signal SLP falls from a high level to a low level to effect an active mode, the potential on each node in the logic circuits is stabilized, whereby clock signals CLK/CLKB can be safely received therein. The potential changes of mode signals SLP/SLPB turn on the switching transistor 104 to equalize the potential of the local source line QVCC with the potential of the global source line VCC, thereby stabilizing the potential on node "A" as input data "High".

In period T6, clock signal CLK falls to a low level due to the operation in the circuit during the transient period T5, whereby the latch circuit again enters a state for passing an input data signal. Thus, a next data "High" input to node "A" is transferred through the inverter gate including low-threshold pMOSFET 112 and low-threshold nMOSFET 113 and the low-threshold inverter gate 114 to node "B" as a data "Low", which is further transferred to node "C" as a data "High" through low-threshold inverter gate 117.

Figure 6:
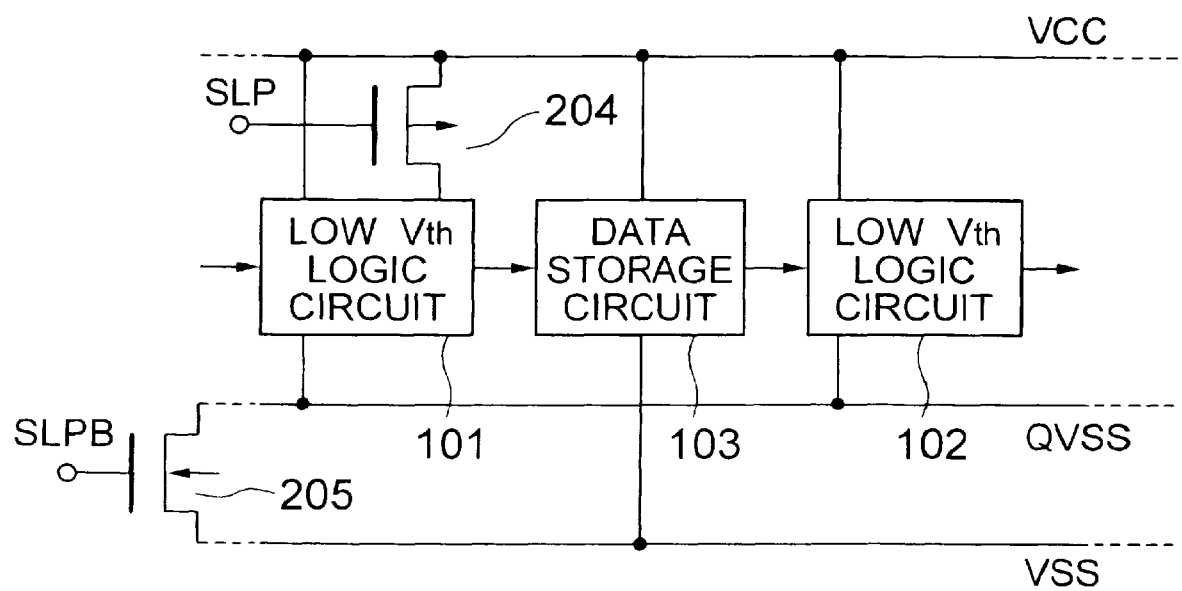
FIG. 6 is a schematic block diagram of a semiconductor integrated circuit according to a second embodiment of the present invention.

Referring to FIG. 6, a semiconductor integrated circuit according to a second embodiment of the present invention is similar to the first embodiment except that the power source is supplied by a global ground line (first global source line) VSS, a global source line (second global source line) VCC and a local ground line QVSS in the present embodiment. A high-threshold source switching transistor 205 is provided for coupling the global ground line VSS and the local ground line QVSS, and controlled by the mode signal SLPB for effecting an active mode or a sleep mode.

The transistors in the low-threshold logic circuit 101 and 102 are implemented by low-threshold transistors. The low-threshold logic circuits in the semiconductor integrated circuit are categorized into two types in terms of source voltage. Specifically, the logic circuit 102 is of the first type connected directly to the global source line VCC and the global ground line QVSS. The logic circuit 101 is of the second type having a first circuit section connected directly to the global source line VCC and the local ground line QVSS, and a second circuit section connected directly to the local ground line QVSS and to the global source line VCC through a mode switching transistor 204 having a high threshold voltage.

The data storage circuit 103 includes low-threshold transistors as well as high-threshold transistors, and supplied with source voltage directly from the global source line VCC and the global ground line VSS, as in the case of the first embodiment. The configurations of the data storage circuit 103 are similar to those of the data latch circuit 303 described in JP-A-6-29834.

Figure 7:
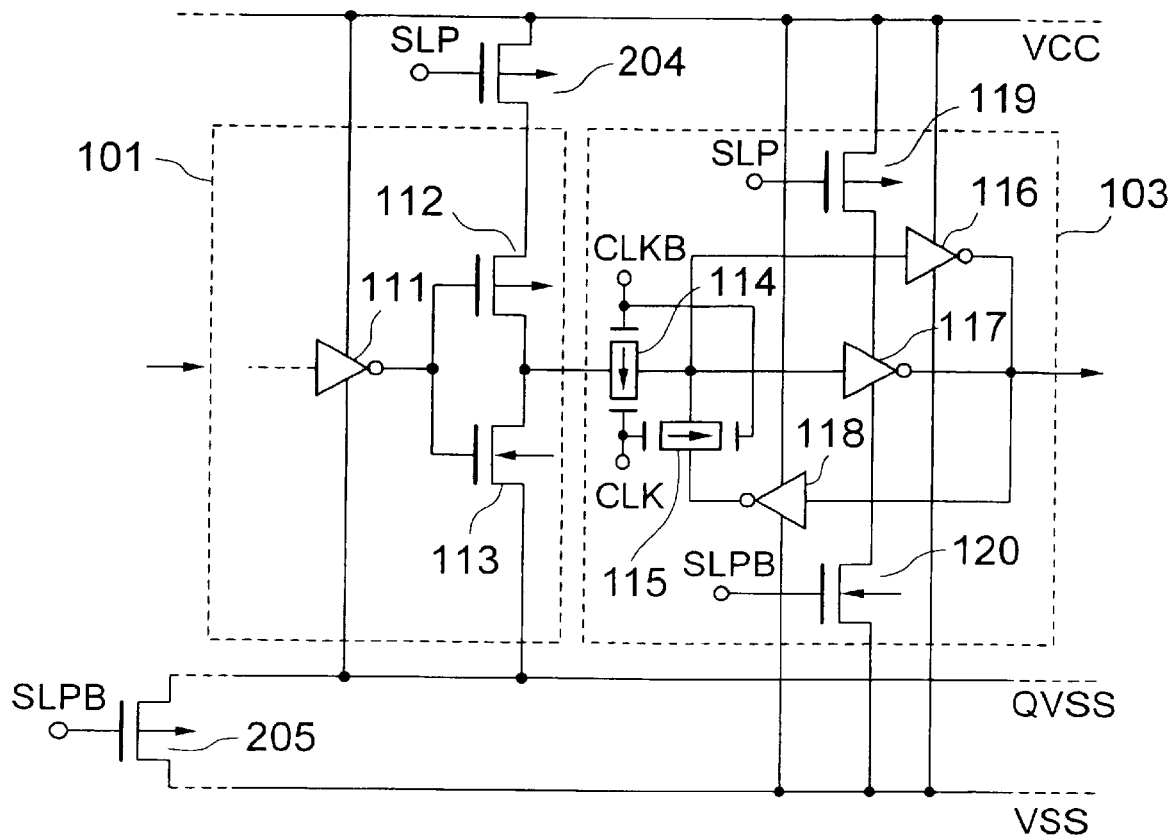
FIG. 7 is a circuit diagram of the semiconductor integrated circuit of FIG. 6.

Referring to FIG. 7 showing the detail of the semiconductor integrated circuit of FIG. 6 similarly to FIG. 2, the output stage of the low-threshold logic circuit 101 is implemented by a CMOS inverter gate including a low-threshold pMOSFET 112 and a low-threshold nMOSFET 113. The source of the pMOSFET 112 is connected to the global source line VCC through a high-threshold pMOSFET 204 and the source of the nMOSFET 113 is directly connected to the local ground line QVSS. The other circuit section of the low-threshold logic circuit 101 including the inverter gate 111 for driving the output stage CMOS inverter gate is directly connected to the global source line VCC and the local ground line QVSS. The data storage circuit 103 is implemented in this example by a latch circuit similar to the latch circuit in the first embodiment.

The operation of the semiconductor integrated circuit of the present embodiment is controlled by the complementary mode signals SLP/SLPB, which turn on the high-threshold pMOSFETs 204 and 119 and the high-threshold nMOSFETs 205 and 120 for entering an active mode, and turn off these transistors 204, 119, 205 and 120 for entering a sleep mode. The complementary clock signals CLK/CLKB control the latch circuit 103 for passing an input data signal or latching the data signal passed therethrough. In the present embodiment, the global source line VCC, the global ground line VSS and the local ground line QVSS constitute power source circuit.

Figure 8:
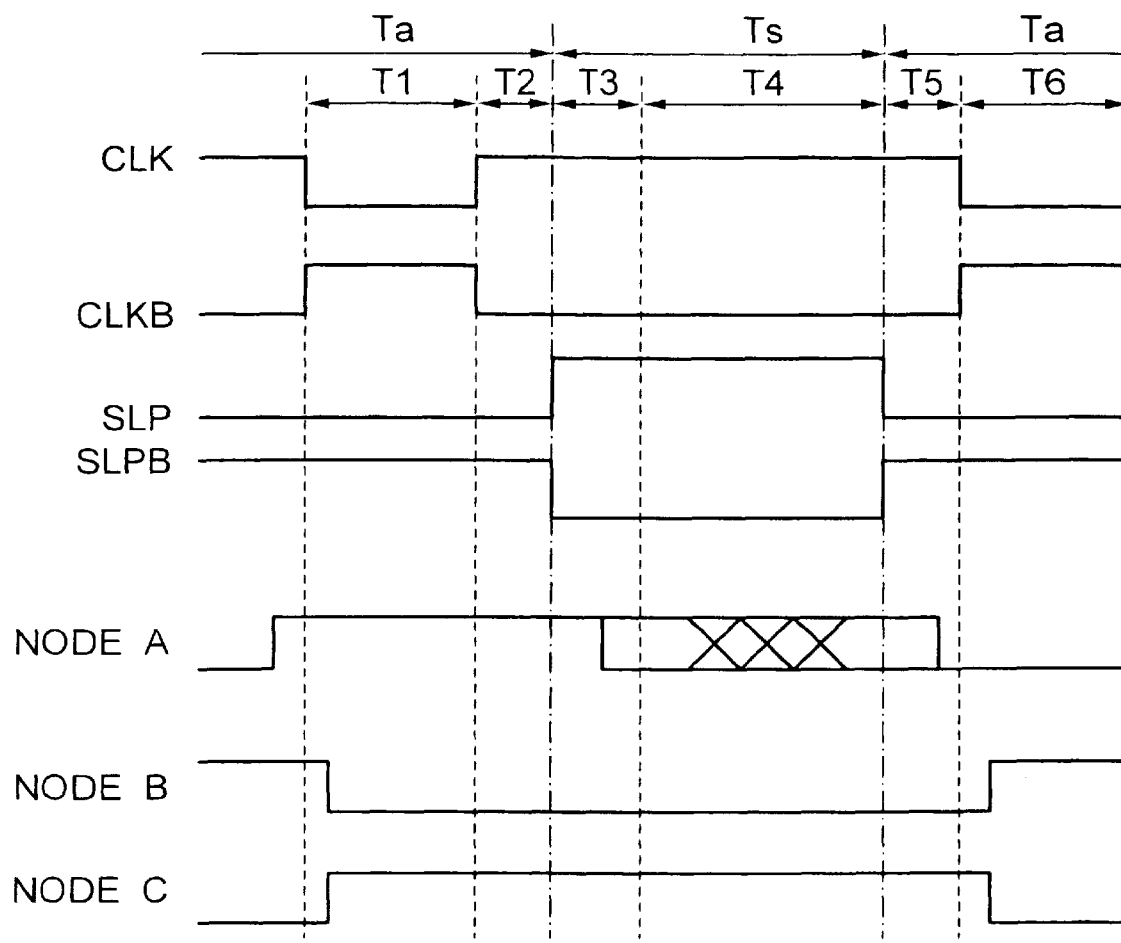
FIG. 8 is a signal timing chart of the semiconductor integrated circuit of FIG. 6.

Referring to FIG. 8, there are shown clock signals CLK/CLKB, mode signals SLP/SLPB, and signal potentials on the nodes "A", "B" and "C" in the semiconductor integrated circuit of FIG. 6. The clock signals CLK/CLKB and the mode signals SLP/SLPB are similar to those in the first embodiment. The time periods Ta and Ts denote the active mode and the sleep mode, respectively, of the semiconductor integrated circuit. The operation of the present embodiment will be described hereinafter by further dividing these time periods Ta and Tb into six periods T1 to T6.

In period T1, mode signal SLP is at a low level (namely, SLPB is at a high level) to effect an active mode. In addition, clock signal CLK is at a low level (namely, CLKB is at a high level) in period T1 to allow the latch circuit 103 to pass input data therethrough. Thus, a data "High" input to node "A" is transferred through the CMOS inverter gate including low-threshold pMOSFET. 112 and low-threshold nMOSFET 113 and the low-threshold inverter gate 114 to node "B" as a data "Low", which is further transferred to node "C" as a data "High" through the low-threshold inverter gate 117. Since the signal path from node "A" to node "C" is implemented by low-threshold transistors, the data is transferred at a high speed.

In period T2, mode signal SLP is at a low level as in the case of period T1, to maintain the active mode. In this period T2, however, clock signal CLK rises from a low level to a high level, thereby allowing the latch circuit 103 to operate in a latch mode. Thus, the data signal input to node "A" as a data "High" is held at the nodes "B" and "C" as data "Low" and "High", respectively, in the latch section including the inverter gates 116 and 118.

In period T3, mode signal SLP rises from a low level to a high level to turn off the switching transistor 205, thereby effecting a sleep mode to allow the local ground line QVSS to enter a floating state. As a result, the output node "A" of the inverter gate 111, which receives the signal potential from the local ground line QVSS, is isolated from the global ground line VSS to enter a floating state. In addition, the switching transistors 119 and 120 are also turned off, whereby the source potentials from the global source line VCC and the global ground line VSS are not supplied to the low-threshold inverter gate 117. Thus, the inverter gate 117 enters an inactive state. At this period, the data on the nodes "B" and "C" are maintained by the high-threshold inverter gates 116 and 118.

In period T4, the state of the circuit appeared in period T3 is maintained. In this period T4, the inverter gates 116 and 118 constituting the latch section maintain the data "Low" and "High" on nodes "B" and "C", due to the potential supply from the global source line VCC and the global ground line VSS. At this stage, the leakage current path possibly formed in the low-threshold transistor 112 from the global source line line VCC to node "B" maintained at a low level is blocked by the high-threshold switching transistor 204 which is off due to the high level of the mode signal SLP. Thus, the leakage current passing through the low-threshold transistor 112 is extremely low and can be neglected.

In period T5, after mode signal SLP falls from a high level to a low level to effect an active mode, the potential on each node in the logic circuits is stabilized, whereby clock signals CLK/CLKB can be safely received therein. The potential changes of mode signals SLP/SLPB turn on the switching transistor 205 to equalize the potential of the local ground line QVSS with the potential of the global ground line VSS, thereby stabilizing the potential on node "A" as the input data "Low".

In period T6, clock signal CLK falls to a low level due to the operation in the circuit during period T5, whereby the latch circuit 103 again enters a state for passing an input data. Thus, a next data "Low" input to node "A" is transferred through the inverter gate including low-threshold pMOSFET 112 and low-threshold nMOSFET 113 and the low-threshold inverter gate 114 to node "B" as a data "High", which is further transferred to node "C" as a data "Low" through the low-threshold inverter gate 117.

In the present embodiment, the high-threshold switching transistor 205 having a large gate width can be implemented by an nMOSFET, which generally has a current driveability larger than the current driveability of a pMOSFET having an equivalent gate width, thereby further reducing the occupied area for the semiconductor integrated circuit.

The low-threshold transfer gate 115 as used in the signal loop of the latch section in the first and second embodiments does not cause any penetrating current because the transfer gate 115 does not generally have a current path toward or from any source line.

Since the above embodiments are described only for examples, the present invention is not limited to the above embodiments and various modifications or alterations can be easily made therefrom by those skilled in the art without departing from the scope of the present invention.

What is claimed is:

1. A semiconductor integrated circuit comprising:

a power source circuit having only three source lines, said power source circuit including a first global source line, a local source line coupled to said first global source line by a source switching transistor and a second global source line; a low threshold logic circuit connected between said local source line and said second global source line, said low-threshold logic circuit including an output stage; a data storage circuit connected between said first global source line and said second global source line, said data storage circuit including a low-threshold input section for receiving a data signal from said output stage and a high-threshold latch section for latching the data signal received by said input section, said power source circuit further including a first mode switching transistor for coupling said output stage and said second global source line, a second mode switching transistor for coupling said input section and said first global source line, and a third mode switching transistor for coupling said input section and said second source line, each of said first through third switching transistors and said source switching transistor being controlled by a mode signal for supplying power from said first and second global source lines.

2. The semiconductor integrated circuit as defined in claim 1, wherein said mode signal effects an active mode and a sleep mode of said semiconductor integrated circuit.

3. The semiconductor integrated circuit as defined in claim 2, wherein each of said first through third mode switching transistors and said source switching transistor are off during said sleep mode.

4. The semiconductor integrated circuit as defined in claim 2, wherein said input section passes a data signal to said data latch section during said active mode.

5. The semiconductor integrated circuit as defined in claim 4, wherein said input section stops a data signal during said sleep mode.

6. The semiconductor integrated circuit as defined in claim 1, wherein said high-threshold latch section includes a low-threshold transfer gate in a signal path of said high-threshold latch section.

\* \* \* \* \*

UNITED STATES PATENT AND TRADEMARK OFFICE
CERTIFICATE OF CORRECTION

PATENT NO. : 6,208,170 B1　　　　　　　　　　　　　　　　　　　　　Page 1 of 1
DATED : March 27, 2001
INVENTOR(S) : Hiroaki Iwaki, et al.

It is certified that error appears in the above-identified patent and that said Letters Patent is hereby corrected as shown below:

Title page,
Item [56], under "FOREIGN PATENT DOCUMENTS",
Line 2, "5-281929" should read -- 5-291929 --

Signed and Sealed this

Thirtieth Day of October, 2001

Attest:

NICHOLAS P. GODICI
Attesting Officer　　　Acting Director of the United States Patent and Trademark Office